(12) United States Patent
Boon et al.

(10) Patent No.: US 8,445,330 B2
(45) Date of Patent: *May 21, 2013

(54) INTERCONNECTS FOR PACKAGED SEMICONDUCTOR DEVICES AND METHODS FOR MANUFACTURING SUCH DEVICES

(75) Inventors: Suan Jeung Boon, Singapore (SG); Yong Poo Chia, Singapore (SG); Meow Koon Eng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/459,801

(22) Filed: Apr. 30, 2012

(65) Prior Publication Data

US 2012/0211896 A1    Aug. 23, 2012

Related U.S. Application Data

(60) Continuation of application No. 12/875,958, filed on Sep. 3, 2010, now Pat. No. 8,168,476, which is a division of application No. 11/848,836, filed on Aug. 31, 2007, now Pat. No. 7,791,203.

(30) Foreign Application Priority Data

Jul. 12, 2007  (SG) ............................. 200705178-2

(51) Int. Cl.
*H01L 21/00* (2006.01)
*H01L 23/48* (2006.01)

(52) U.S. Cl.
USPC ............ 438/125; 438/126; 257/773; 257/735

(58) Field of Classification Search
None
See application file for complete search history.

(56) References Cited

U.S. PATENT DOCUMENTS

| | | | |
|---|---|---|---|
| 4,907,127 | A | 3/1990 | Lee |
| 5,006,922 | A | 4/1991 | McShane et al. |
| 5,098,864 | A | 3/1992 | Mahulikar |
| 5,102,829 | A | 4/1992 | Cohn |
| 5,144,412 | A | 9/1992 | Chang et al. |

(Continued)

FOREIGN PATENT DOCUMENTS

| | | |
|---|---|---|
| EP | 1154474 A1 | 11/2001 |
| KR | 20010018694 | 3/2001 |
| TW | 250597 B | 3/2006 |
| WO | 2007025812 A1 | 3/2007 |

OTHER PUBLICATIONS

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

International Search Report and Written Opinion for International Application No. PCT/US2008/069520, Aug. 21, 2008.

(Continued)

*Primary Examiner* — Scott B Geyer
(74) *Attorney, Agent, or Firm* — Perkins Coie LLP

(57) ABSTRACT

Packaged semiconductor devices and assemblies including interconnects and methods for forming such interconnects are disclosed herein. One embodiment of a packaged semiconductor assembly includes a die attached to a support layer. A plurality of interconnects are embedded in and project from the support layer, such that the support layer at least partially retains the interconnects in a predetermined array. An encapsulant is molded around each of the interconnects and encases at least a portion of the die, support layer and interconnects.

20 Claims, 8 Drawing Sheets

U.S. PATENT DOCUMENTS

| | | | |
|---|---|---|---|
| 5,145,099 | A | 9/1992 | Wood et al. |
| 5,200,366 | A | 4/1993 | Yamada et al. |
| 5,291,062 | A | 3/1994 | Higgins, III |
| 5,485,039 | A | 1/1996 | Fujita et al. |
| 5,550,403 | A | 8/1996 | Carichner |
| 5,726,493 | A | 3/1998 | Yamashita et al. |
| 5,734,555 | A | 3/1998 | McMahon |
| 5,776,824 | A | 7/1998 | Farnworth et al. |
| 5,821,532 | A | 10/1998 | Beaman et al. |
| 5,851,845 | A | 12/1998 | Wood et al. |
| 6,008,070 | A | 12/1999 | Farnworth |
| 6,097,087 | A | 8/2000 | Farnworth et al. |
| 6,103,547 | A | 8/2000 | Corisis et al. |
| 6,114,240 | A | 9/2000 | Akram et al. |
| 6,124,634 | A | 9/2000 | Akram et al. |
| 6,133,622 | A | 10/2000 | Corisis et al. |
| 6,137,163 | A | 10/2000 | Kim et al. |
| 6,159,764 | A | 12/2000 | Kinsman et al. |
| 6,184,465 | B1 | 2/2001 | Corisis |
| 6,222,270 | B1 | 4/2001 | Lee et al. |
| 6,228,687 | B1 | 5/2001 | Akram et al. |
| 6,229,202 | B1 | 5/2001 | Corisis |
| 6,246,108 | B1 | 6/2001 | Corisis et al. |
| 6,271,580 | B1 | 8/2001 | Corisis |
| 6,291,894 | B1 | 9/2001 | Farnworth et al. |
| 6,294,837 | B1 | 9/2001 | Akram et al. |
| 6,326,697 | B1 | 12/2001 | Farnworth |
| 6,448,106 | B1 | 9/2002 | Wang et al. |
| 6,576,531 | B2 | 6/2003 | Peng et al. |
| 6,582,992 | B2 | 6/2003 | Poo et al. |
| 6,620,731 | B1 | 9/2003 | Farnworth et al. |
| 6,774,486 | B2 | 8/2004 | Kinsman |
| 6,797,616 | B2 | 9/2004 | Kinsman |
| 6,809,025 | B2 | 10/2004 | Sandhu et al. |
| 6,828,175 | B2 | 12/2004 | Wood et al. |
| 6,847,109 | B2 | 1/2005 | Shim |
| 6,858,891 | B2 | 2/2005 | Farnworth et al. |
| 6,885,107 | B2 | 4/2005 | Kinsman |
| 6,903,442 | B2 | 6/2005 | Wood et al. |
| 6,903,443 | B2 | 6/2005 | Farnworth et al. |
| 6,946,325 | B2 | 9/2005 | Yean et al. |
| 6,982,487 | B2 | 1/2006 | Kim et al. |
| 7,037,836 | B2 | 5/2006 | Lee |
| 7,083,425 | B2 | 8/2006 | Chong et al. |
| 7,084,073 | B2 | 8/2006 | Lee et al. |
| 7,091,124 | B2 | 8/2006 | Rigg et al. |
| 7,109,068 | B2 | 9/2006 | Akram et al. |
| 7,151,009 | B2 | 12/2006 | Kim et al. |
| 7,170,183 | B1 | 1/2007 | Kim et al. |
| 7,190,061 | B2 | 3/2007 | Lee |
| 7,199,050 | B2 | 4/2007 | Hiatt |
| 7,217,596 | B2 | 5/2007 | Cobbley et al. |
| 7,262,134 | B2 | 8/2007 | Kirby et al. |
| 7,271,482 | B2 | 9/2007 | Kirby |
| 7,300,857 | B2 | 11/2007 | Akram et al. |
| 7,378,726 | B2 | 5/2008 | Punzalan et al. |
| 7,791,203 | B2 * | 9/2010 | Boon et al. ............ 257/773 |
| 8,168,476 | B2 * | 5/2012 | Suan Jeung et al. ......... 438/125 |
| 2003/0042564 | A1 | 3/2003 | Taniguchi et al. |
| 2003/0216023 | A1 | 11/2003 | Wark et al. |
| 2004/0004280 | A1 | 1/2004 | Shibata |
| 2004/0046251 | A1 | 3/2004 | Lee |
| 2004/0178491 | A1 | 9/2004 | Akram et al. |
| 2004/0198033 | A1 | 10/2004 | Lee et al. |
| 2004/0219763 | A1 | 11/2004 | Kim et al. |
| 2005/0046002 | A1 | 3/2005 | Lee et al. |
| 2005/0104228 | A1 | 5/2005 | Rigg et al. |
| 2005/0110889 | A1 | 5/2005 | Tuttle et al. |
| 2005/0127478 | A1 | 6/2005 | Hiatt et al. |
| 2005/0150683 | A1 | 7/2005 | Farnworth et al. |
| 2005/0184219 | A1 | 8/2005 | Kirby |
| 2005/0208766 | A1 | 9/2005 | Kirby et al. |
| 2005/0227382 | A1 | 10/2005 | Hui |
| 2005/0231626 | A1 | 10/2005 | Tuttle et al. |
| 2005/0236708 | A1 | 10/2005 | Farnworth et al. |
| 2005/0247894 | A1 | 11/2005 | Watkins et al. |
| 2005/0253213 | A1 | 11/2005 | Jiang et al. |
| 2005/0254133 | A1 | 11/2005 | Akram et al. |
| 2005/0258530 | A1 | 11/2005 | Vindasius et al. |
| 2005/0275048 | A1 | 12/2005 | Farnworth et al. |
| 2005/0275049 | A1 | 12/2005 | Kirby et al. |
| 2005/0275051 | A1 | 12/2005 | Farnworth et al. |
| 2005/0275750 | A1 | 12/2005 | Akram et al. |
| 2005/0277293 | A1 | 12/2005 | Kim et al. |
| 2005/0282374 | A1 | 12/2005 | Hwang et al. |
| 2006/0011809 | A1 | 1/2006 | Farnworth et al. |
| 2006/0014313 | A1 | 1/2006 | Hall et al. |
| 2006/0023107 | A1 | 2/2006 | Bolken et al. |
| 2006/0024856 | A1 | 2/2006 | Derderian et al. |
| 2006/0035402 | A1 | 2/2006 | Street et al. |
| 2006/0035415 | A1 | 2/2006 | Wood et al. |
| 2006/0038183 | A1 | 2/2006 | Oliver |
| 2006/0038272 | A1 | 2/2006 | Edwards |
| 2006/0040421 | A1 | 2/2006 | Farnworth et al. |
| 2006/0040428 | A1 | 2/2006 | Johnson |
| 2006/0042952 | A1 | 3/2006 | Oliver et al. |
| 2006/0043262 | A1 | 3/2006 | Akram |
| 2006/0043509 | A1 | 3/2006 | Watkins et al. |
| 2006/0043512 | A1 | 3/2006 | Oliver et al. |
| 2006/0043569 | A1 | 3/2006 | Benson et al. |
| 2006/0044433 | A1 | 3/2006 | Akram |
| 2006/0046332 | A1 | 3/2006 | Derderian et al. |
| 2006/0046438 | A1 | 3/2006 | Kirby |
| 2006/0046468 | A1 | 3/2006 | Akram et al. |
| 2006/0046471 | A1 | 3/2006 | Kirby et al. |
| 2006/0057776 | A1 | 3/2006 | Tao |
| 2006/0057836 | A1 | 3/2006 | Nagarajan et al. |
| 2006/0148250 | A1 | 7/2006 | Kirby |
| 2006/0177959 | A1 | 8/2006 | Boettiger et al. |
| 2006/0177999 | A1 | 8/2006 | Hembree et al. |
| 2006/0180941 | A1 | 8/2006 | Kirby et al. |
| 2006/0186097 | A1 | 8/2006 | Watkins et al. |
| 2006/0186492 | A1 | 8/2006 | Boettiger et al. |
| 2006/0191882 | A1 | 8/2006 | Watkins et al. |
| 2006/0199363 | A1 | 9/2006 | Kirby et al. |
| 2006/0216862 | A1 | 9/2006 | Rigg et al. |
| 2006/0255443 | A1 | 11/2006 | Hwang et al. |
| 2006/0264041 | A1 | 11/2006 | Rigg et al. |
| 2006/0270108 | A1 | 11/2006 | Farnworth et al. |
| 2006/0289968 | A1 | 12/2006 | Sulfridge |
| 2006/0290001 | A1 | 12/2006 | Sulfridge |
| 2006/0292877 | A1 | 12/2006 | Lake |
| 2007/0012655 | A1 | 1/2007 | Kwon et al. |
| 2007/0023121 | A1 | 2/2007 | Jones et al. |
| 2007/0032061 | A1 | 2/2007 | Farnworth et al. |
| 2007/0045388 | A1 | 3/2007 | Farnworth et al. |
| 2007/0045515 | A1 | 3/2007 | Farnworth et al. |
| 2007/0045632 | A1 | 3/2007 | Oliver et al. |
| 2007/0045779 | A1 | 3/2007 | Hiatt |
| 2007/0045806 | A1 | 3/2007 | Hsuan |
| 2007/0045812 | A1 | 3/2007 | Heng |
| 2007/0045826 | A1 | 3/2007 | Lee et al. |
| 2007/0045834 | A1 | 3/2007 | Chong et al. |
| 2007/0048994 | A1 | 3/2007 | Tuttle |
| 2007/0049016 | A1 | 3/2007 | Hiatt et al. |
| 2007/0057028 | A1 | 3/2007 | Lake et al. |
| 2007/0122940 | A1 | 5/2007 | Gautham |
| 2007/0145563 | A1 | 6/2007 | Punzalan et al. |
| 2007/0178694 | A1 | 8/2007 | Hiatt |
| 2007/0202617 | A1 | 8/2007 | Hembree |
| 2007/0222050 | A1 | 9/2007 | Lee et al. |
| 2007/0222054 | A1 | 9/2007 | Hembree |
| 2007/0262424 | A1 | 11/2007 | Hiatt |
| 2008/0050904 | A1 | 2/2008 | Lake |
| 2008/0050911 | A1 | 2/2008 | Borthakur |
| 2008/0054444 | A1 | 3/2008 | Tuttle |
| 2008/0057620 | A1 | 3/2008 | Pratt |
| 2008/0081398 | A1 | 4/2008 | Lee et al. |
| 2009/0007934 | A1 | 1/2009 | Hutto |
| 2009/0014859 | A1 | 1/2009 | Jeung et al. |
| 2009/0057912 | A1 | 3/2009 | Kheng |
| 2009/0146312 | A1 | 6/2009 | Sulfridge |
| 2009/0166846 | A1 | 7/2009 | Pratt et al. |
| 2009/0283898 | A1 | 11/2009 | Janzen et al. |

OTHER PUBLICATIONS

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Pienimaa, S.K. et al., "Stacked Thin Dice Package," Proceedings of the 51st Electronic Components and Technology Conference, 2001, pp. 361-366, IEEE.

Savastiouk, S. et al., "Thru-silicon interconnect technology," 26th IEEE/CPMT International Electronics Manufacturing Technology Symposium, 2000, abstract.

Search Report and Written Opinion issued Mar. 30, 2009 in Singapore Application No. 200705178-2.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

* cited by examiner

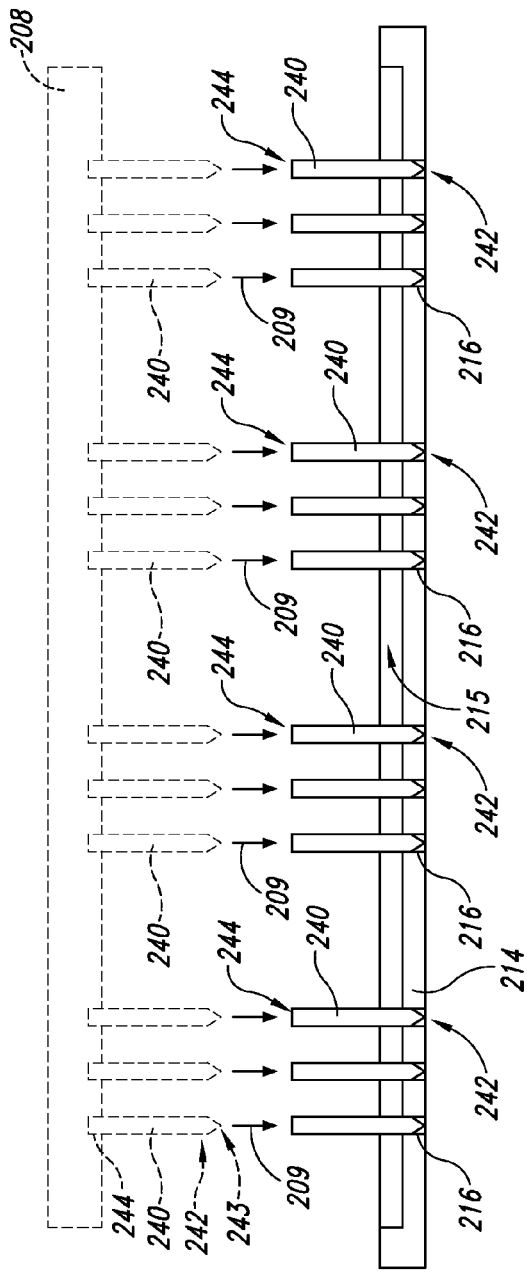
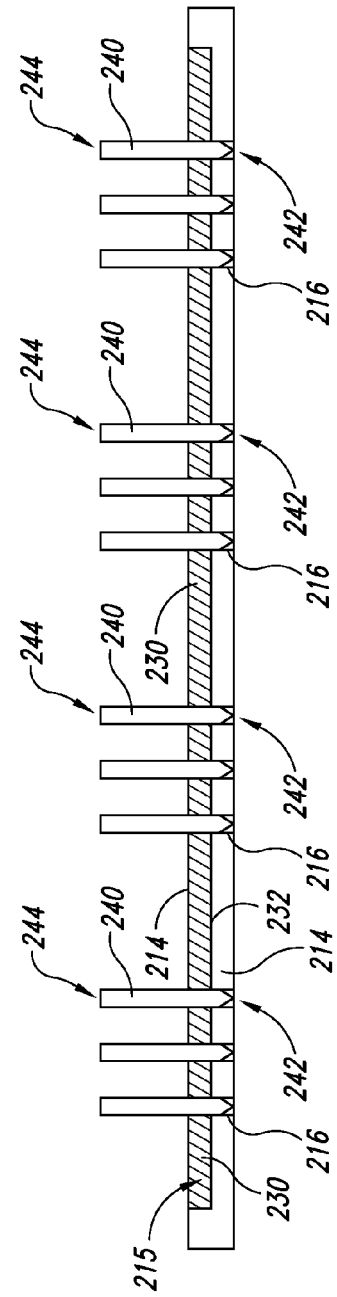

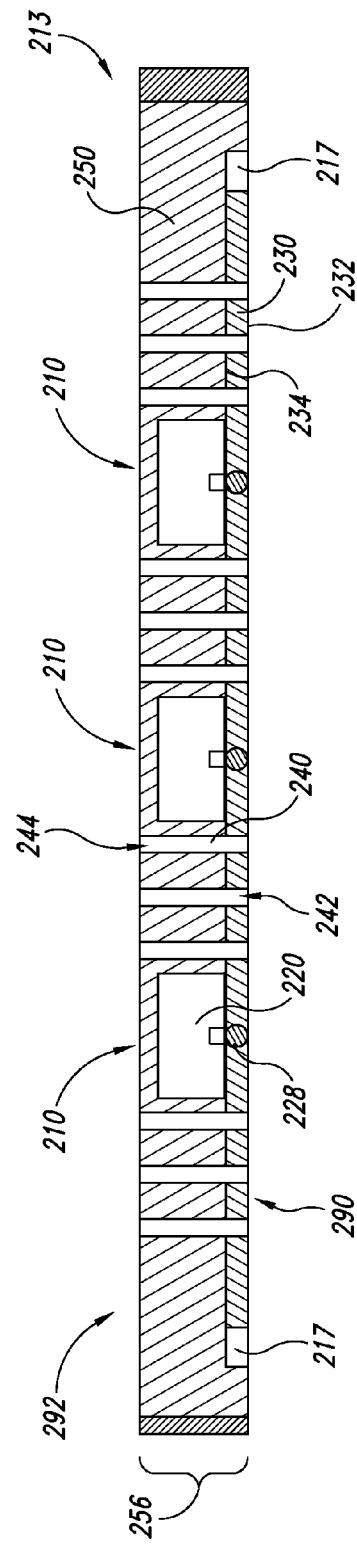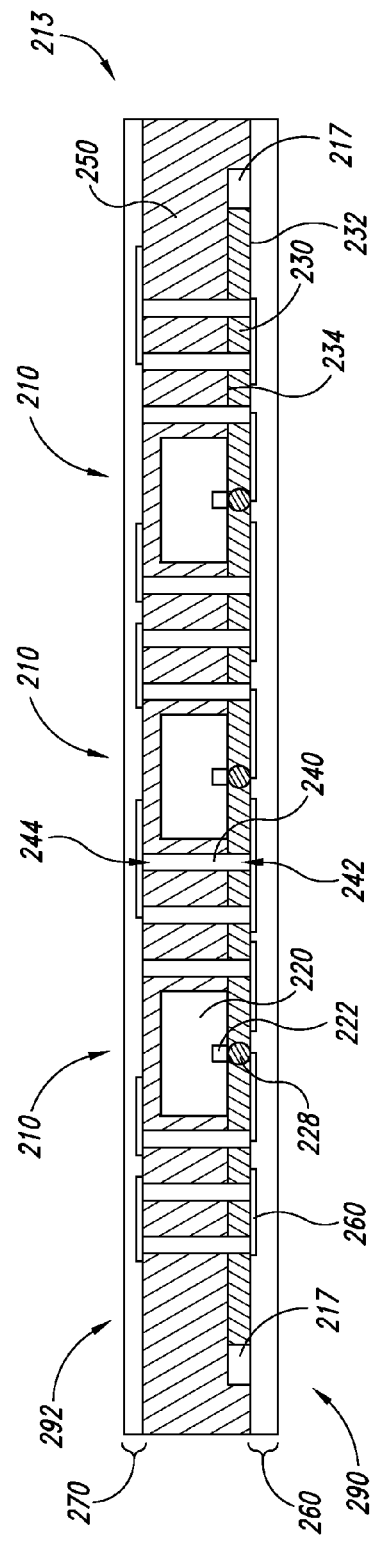

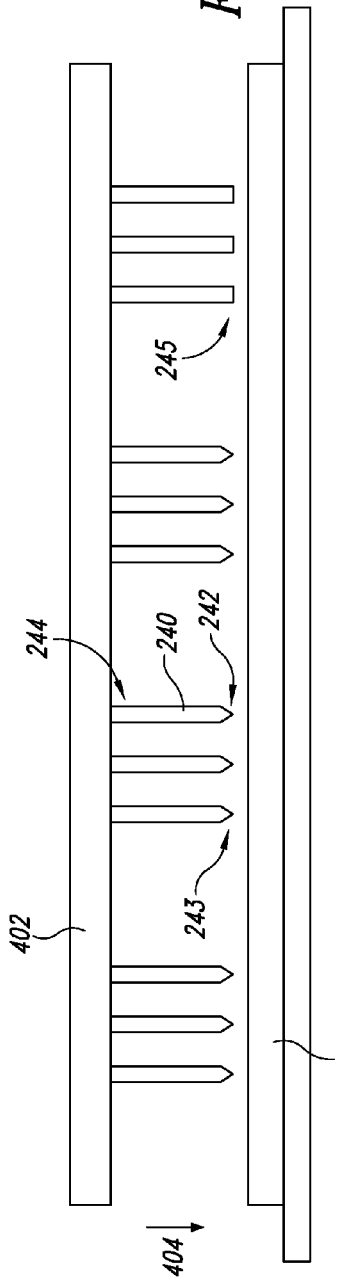
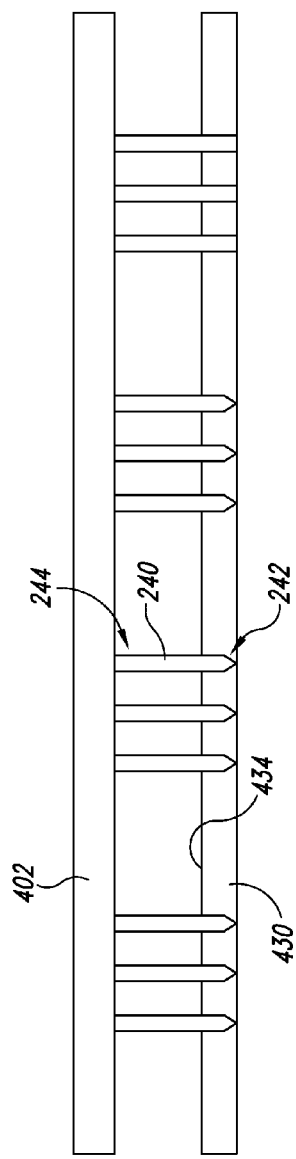
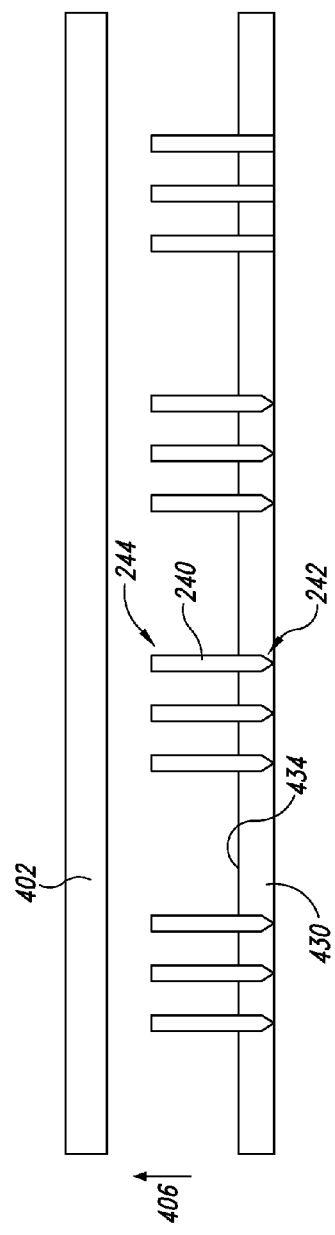

INTERCONNECTS FOR PACKAGED SEMICONDUCTOR DEVICES AND METHODS FOR MANUFACTURING SUCH DEVICES

CROSS-REFERENCE TO RELATED APPLICATIONS

This application is a continuation of U.S. application Ser. No. 12/875,958, filed Sep. 3, 2010, now U.S. Pat. No. 8,168,476, which is a divisional of U.S. application Ser. No. 11/848,836, filed Aug. 31, 2007, now U.S. Pat. No. 7,791,203, which claims foreign priority benefits of Singapore Application No. 200705178-2, filed Jul. 12, 2007, each of which is incorporated herein by reference in its entirety.

TECHNICAL FIELD

The present invention relates to interconnects for packaged semiconductor assemblies, stacked semiconductor assemblies, and methods for manufacturing such assemblies.

BACKGROUND

Semiconductor products require packaged semiconductor assemblies with a high density of devices in a relatively small space. For example, the space available for memory devices, processors, displays and other microfeature devices is continually decreasing in cell phones, personal digital assistants, laptop computers and many other products. One technique to increase the density of semiconductor devices within a given footprint is to stack semiconductor devices and assemblies, and many stacked semiconductor assemblies require adequate electrical interconnects within and between the packages.

Conventional interconnects electrically connect the integrated circuitry of a semiconductor device (such as a die) with other devices or stacked packages. These interconnects can be formed by creating a via in the packaging material and then filling or plugging the via with conductive material. FIG. 1 illustrates an earlier interconnect 100 including a plugged via 110. The via 110 is formed by drilling or etching a hole through an interposer substrate 112. The interconnect is then formed by plating a conductive material 114 into the via 110, and patterning the conductive material 114 so that it is electrically isolated. The remaining void in the via 110 is filled with a conductive material 116 that plugs the via 110. The conductive material 114 electrically connects a pad 117 at a first side of the package with a solder ball 118 (or other conductive feature) at a second side of the package.

One challenge associated with the interconnect 100 in FIG. 1 is the difficulty of achieving uniform metallization in the vias. Non-uniform plating within the vias decreases the quality and integrity of the interconnect. For example, vias having a high aspect ratio (i.e., ratio of the depth to the size of the opening) are especially difficult to consistently plate and fill. Moreover, in certain circumstances the filling process can trap air in the via that can cause the interconnect or assembly to crack as the fill material and the assembly harden. Such non-uniformities in the vias provide inconsistent electrical connections and compromise the integrity of the metallization of the interconnects.

Other challenges associated with existing interconnects are the cost, time and complexity of forming, plating and filling the vias. Forming the vias by an ablation or drilling process typically requires forming individual vias in a sequential manner; this increases the processing time to form the vias. Simultaneously forming the vias by an etching process can be much faster, but etching can result in inconsistent sizes of the vias. It can also be difficult to achieve a dense distribution of the vias with an etching process. Moreover, the plating and filling processing steps following the via formation require additional processing time.

BRIEF DESCRIPTION OF THE DRAWINGS

FIGS. 3-8 are side cross-sectional views illustrating various stages in a method of forming interconnects in a packaged semiconductor assembly in accordance with embodiments of the invention.

FIGS. 11A-11C are side cross-sectional views illustrating various stages in a method of forming interconnects in a packaged semiconductor assembly in accordance with still another embodiment of the invention.

DETAILED DESCRIPTION

Several embodiments of the present invention are directed toward packaged semiconductor devices with interconnects and methods of forming interconnects in packaged semiconductor devices. Many specific details of the invention are described below with reference to methods of forming the interconnects. The term "semiconductor assembly" is used throughout to include a variety of articles of manufacture including, for example, semiconductor wafers having active components, individual integrated circuit dies, packaged dies, and two or more semiconductor devices or assemblies in a stacked configuration. Many specific details of certain embodiments of the invention are set forth in FIGS. 2-13 and the following text to provide a thorough understanding of these embodiments. Several other embodiments of the invention can have different configurations, components or processes than those described in this section. A person skilled in the art, therefore, will appreciate that the invention may have additional embodiments or that the invention may be practiced without several details of the embodiments shown in FIGS. 2-13.

Figure 1:
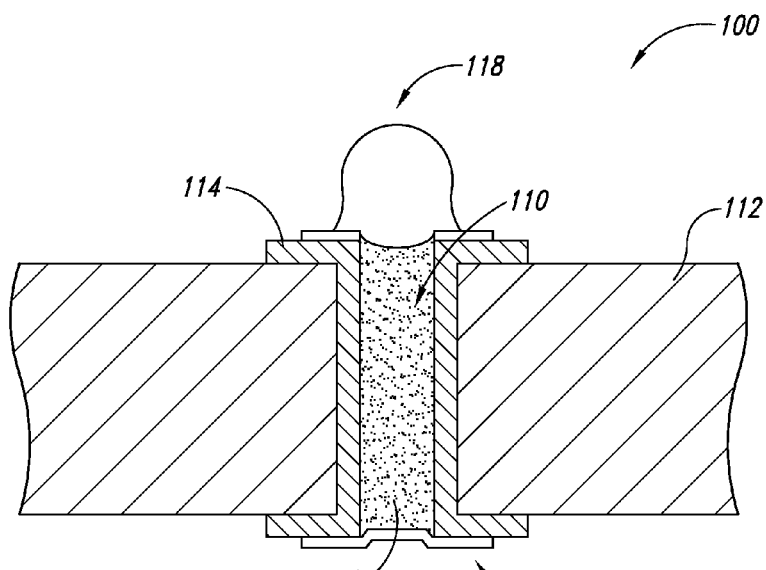
FIG. 1 is a side cross-sectional view of a portion of an interconnect in an interposer substrate in accordance with the prior art.
Figure 2:
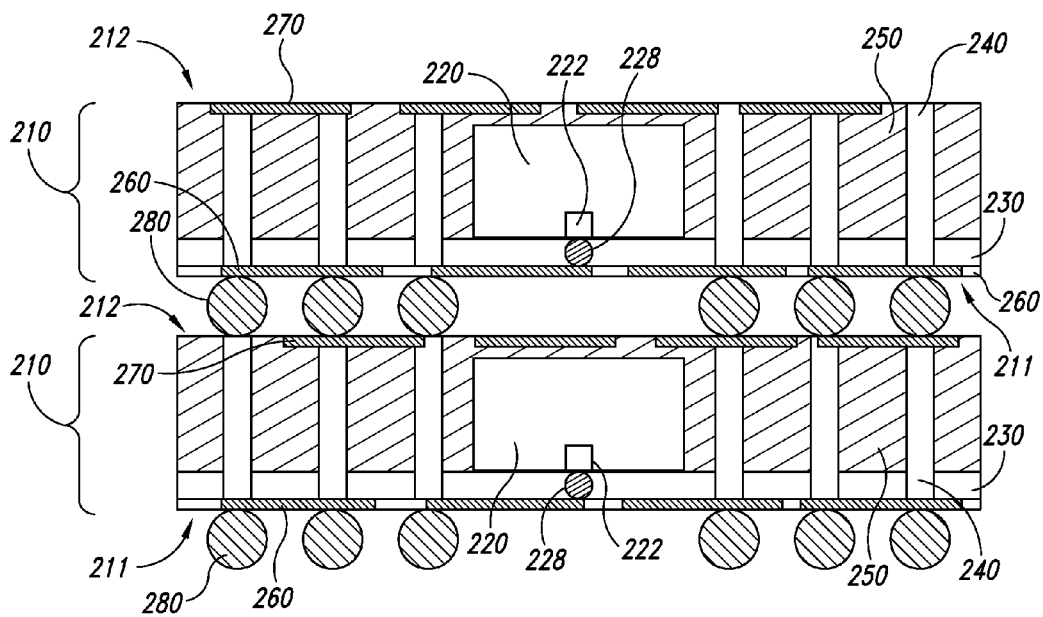
FIG. 2 is a side cross-sectional view of a stacked semiconductor assembly in accordance with an embodiment of the invention.

FIG. 2 is a side cross-sectional view of a stacked semiconductor assembly 200 in accordance with one embodiment of the invention. The assembly 200 includes two or more packaged semiconductor assemblies 210 in a stacked configuration. In this embodiment, each assembly 210 includes a microelectronic die 220 attached to a support layer 230, and a plurality of interconnects 240 retained in and projecting from the support layer 230 in a predetermined configuration. The interconnects 240 can comprise a plurality of preformed pin-like members or other pre-formed conductive structures. Individual assemblies 210 also include an encapsulant 250 molded over the die 220 and between the interconnects 240. In the illustrated embodiment, each assembly 210 can further include optional first and second redistribution structures 260 and 270 at opposite sides of the package, and a plurality of conductive members 280 attached to the first redistribution layer 260. As explained in more detail below, the interconnects 240 can (a) provide high quality through package interconnections, (b) be formed relatively quickly, and (c) simplify the processing steps.

In the embodiment shown in FIG. 2, individual interconnects 240 are preformed pins or pin-like members extending from a first side 211 of the package to a second side 212 of the package. The pre-formed pins provide a uniform electrical connection through the package 210 without requiring the complex processes of forming, plating and filling vias through a package as in conventional interconnects. Instead of forming and filling vias, the interconnects 240 are preformed in a separate process and then retained in a desired configuration before encapsulating the die 220 with the encapsulant 250. In certain embodiments, the interconnects 240 can be composed of a conductive material such as copper, nickel, gold and/or silver, or any other suitable conductive material(s). Individual interconnects 240 can also have a generally cylindrical shape and are all approximately the same size. In certain embodiments however, the interconnects 240 may differ in size or shape according to the needs and application of the packaged assembly. The interconnects 240 typically have a diameter of 100 μm or more, although in certain embodiments the diameter may be less. As explained in more detail below, the interconnects 240 are inserted into the support layer 230, a plate (not shown), or another type of support member in a predetermined configuration or array. Thereafter, the support layer 230 (or plate) retains the interconnects 240 in the desired configuration while the encapsulant 250 is molded around the interconnects 240 and the die 220. As such, the interconnects 240 provide a continuous and uniform conductive structure through the encapsulation 250 and avoid some of the complexities associated with forming, plating and filling vias of conventional interconnects described above.

FIGS. 3-8 illustrate various stages in a method of forming a plurality of discrete arrays of the interconnects 240 of FIG. 2 in accordance with one embodiment of the invention. FIG. 3, more specifically, illustrates a stage in which a plurality of discrete arrays of interconnects 240 have been mounted to a support plate 214 in a desired configuration. The interconnects 240 can be mounted to the support plate 214 by loading the preformed interconnects 240 into a socket 208 that releasably retains second portions 244 of the interconnects 240 (shown in broken lines). In operation, the socket 208 moves towards the plate 214 (arrows 209) to insert first portions 242 of individual interconnects 240 into corresponding recesses 216 in the plate 214. The second portions 244 of the interconnects 240 are free-standing without a solid material between the second portions 244 at this stage. In this manner, the plurality of interconnects 240 are at least substantially simultaneously mounted to the plate 214. In certain embodiments, the interconnects 240 can be mounted to the plate 214 individually. The recesses 216 can be precision machined holes arranged in a predetermined array corresponding to an interconnect array at a die site of the semiconductor assembly. Such precision machining can enable the recesses 216 to be arranged in a dense array. The first portions 242 can optionally have a beveled or pointed portion 243 to facilitate inserting the interconnects 240 in the recesses 216. The lower portion of the plate 214 is sufficiently thick so that the recesses 216 have a sufficient depth to retain the interconnects 240 in a desired configuration during subsequent processing steps. In certain embodiments, the interconnects 240 can be ultrasonically welded or otherwise adhered to the plate 214, and therefore the plate 214 in such embodiments does not need to have the recesses 216.

The plate 214 can be composed of a metal or a synthetic material, such as an epoxy. In the case of an epoxy plate, it can include the recesses 216 or the epoxy can be partially cured to provide a "self-embedding" plate such that the interconnects 240 can be inserted into the plate 214 without any preformed holes. Once the interconnects 240 are in place, the epoxy plate 214 can be further cured or hardened. This type of self-embedding epoxy plate may mitigate errors caused by misalignment between the interconnects 240 and the recesses 216 in a rigid plate.

The procedure illustrated in FIG. 3 can be performed in a short period of time because the plurality of interconnects 240 can be formed and arranged off-line and then simultaneously mounted to the plate 214 in a single step. This reduces the number of processing steps and thus the processing time. The socket 208 can be a device similar to a test socket or test probe, as is known in the art for electrical testing of packaged assemblies, and used to simultaneously insert multiple interconnects 240 into the plate 214. Moreover, the insertion process can be automated using existing technologies.

After mounting the interconnects 240 to the plate 214, FIG. 4 illustrates a stage in which a dielectric support layer 230 is formed or otherwise disposed in a cavity 215 of the plate 214 and around the interconnects 240. The support layer 230 in FIG. 4 has a first surface 232 contacting the plate 214, and a second surface 234 spaced apart from the first surface 232. In certain embodiments, the support layer 230 can be a polymer disposed in the cavity 215 to surround each of the interconnects 240. Accordingly, the thickness of the support layer 230 can vary according to the depth of the cavity 215 or how much the cavity 215 is filled with the support layer 230.

The support layer 230 provides a dielectric material between the conductive interconnects 240, and the support layer 230 can also retain the first portions 242 of the interconnects 240 in the desired configuration. For example, the support layer 230 can be at least partially cured or hardened to hold the interconnects 240 in a desired configuration during subsequent molding and material removal steps. In certain embodiments, the support layer 230 can be disposed in the cavity 215 before the interconnects 240 are inserted into the plate 214. In this embodiment, the interconnects 240 are inserted through the support layer 230 and into the individual recesses 216 in the plate 214 before curing the support layer 230.

The support layer 230 can also provide a surface to which a plurality of dies can be mounted. For example, the support layer 230 can be a polymeric material in which the second surface 234 becomes tacky in a partially or fully cured state, or a separate adhesive layer can be applied to the second surface 234. Accordingly, individual dies can be securely attached to the second surface 234 of the support layer 230. Moreover, in certain embodiments the support layer 230 can also be a photoimageable polymer that can be patterned to open bond-sites or conductive features on the die.

Figure 5:
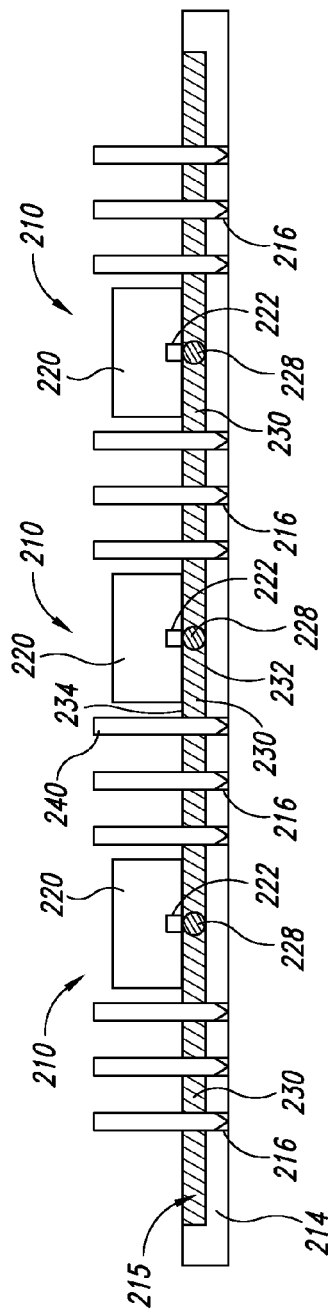

FIG. 5 illustrates a stage in which a plurality of semiconductor dies 220 have been attached to the second surface 234 of the support layer 230. In this embodiment, the active surfaces of individual dies 220 are adhered to the second surface 234 of the support layer 230. The support layer 230 also provides a passivation or protective layer on the active surfaces of the dies 220. The support layer 230 can be deformable at this state so that optional conductive members 228 can project from bond-sites 222 of the dies 220 into the support layer 230. In certain embodiments, the conductive member 228 can be a stud bump formed on the die 220 before the die 220 is attached to the support layer 230. One skilled in the art will appreciate that the die 220 can include other bond-sites or electrically connective features, or that the backside of the die 220 can be attached to the support layer 230.

Figure 6:
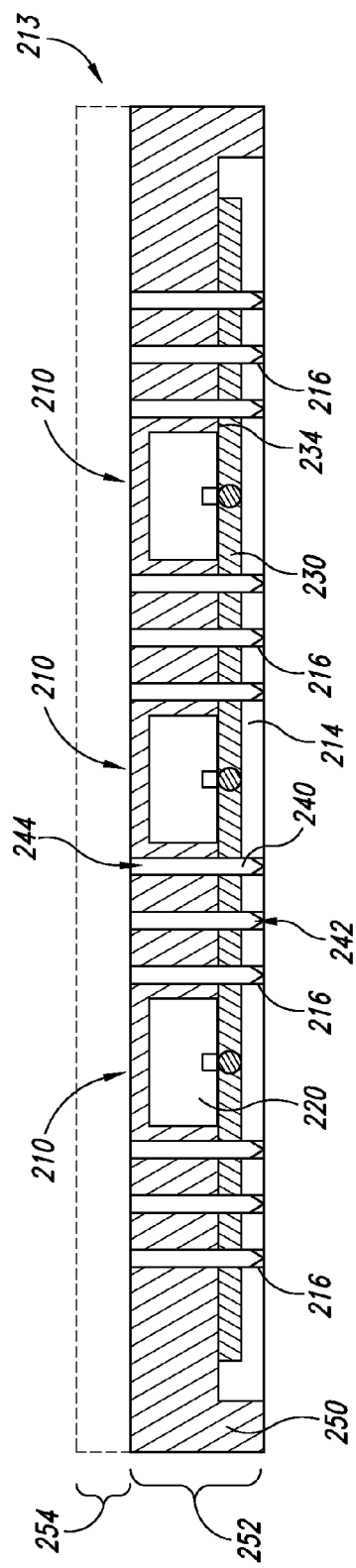

FIG. 6 illustrates a stage in which the encapsulation 250 has been disposed around the components of the sub-assemblies 210 to form a semiconductor workpiece 213. The encapsulant 250 can be composed of a different materials, such as thermosets, thermoplastics, hybridized versions of thermosets and thermoplastics, or any other suitable encapsulating material. In one embodiment, the subassembly of the plate 214, interconnects 240 and dies 220 is positioned in a mold (not shown), and the encapsulant 250 is then molded between the interconnects 240 and over the dies 220 such that the encapsulant 250 at least partially covers each of the dies 220. The mold can be shaped like a conventional semiconductor wafer so that subsequent processes can be performed in wafer processing equipment. The plate 214 and support layer 230 support and retain the interconnects 240 in the predetermined array during the molding process. The encapsulant also protects the dies 220 from contamination (e.g., moisture, particulates, etc.) and electrically isolates the interconnects 240. The thickness of the encapsulant 250 can vary with respect to the length of the interconnects 240. For example, in certain embodiments, the surface of the encapsulant 250 can be coplanar with the second portions 244 of the interconnects 240 after molding as indicated by the portion 252 of the encapsulant 250. In other embodiments, the second portions 244 of the interconnects 240 can be completely over-molded with the encapsulant 250 as indicated by the broken line and the portion 254 of the encapsulant 250. Material removal steps explained below are also used to adjust the thickness of the encapsulant 250 and surface characteristics of the workpiece 213.

FIG. 7 illustrates a stage in which material has been removed from opposite surfaces of the workpiece 213. In one embodiment, the workpiece 213 is ground, planarized and/or etched to remove the material from a first surface 290 of the workpiece 213. The first surface 290, for example, can be formed by removing the material portions of the plate 214 and the support layer 230 to expose the first portions 242 of the interconnects 240. A portion 217 of the plate 214 can remain with the workpiece 213 even though the lower portion of the plate 214 has been removed. A portion of the support layer 230 can also remain to provide a dielectric passivation layer at the surface of the die 220. In the embodiments where the dies 220 include conductive members 228, material can be removed from the workpiece 213 until the conductive members 228 are also exposed. In an optional embodiment, a second surface 292 of the workpiece 213 can be ground, planarized and/or etched to remove a portion of the encapsulant 250 from the workpiece 213. This process can remove a portion of the second portions 244 of the interconnects 240 and expose or clean the second portions 244 of the pins. Accordingly, the thickness 256 of the workpiece 213 can be controlled by accurately forming the first and second surfaces 290 and 292.

FIG. 8 is cross-sectional view of the assembly 210 after a first redistribution structure 260 has been formed at the first side 290 of the workpiece 213, and a second redistribution structure 270 has been formed at the second side 292 of the workpiece 213. The first and second redistribution structures 260 and 270 can be configured to electrically connect the bond-sites 222 of the dies 220 to one or more of the interconnects 240. In embodiments without conductive members 228 projecting from the die 220, the support layer 230 is patterned to expose the bond-sites 222, and then bumps, balls, wire bonds or other conductive members are attached to the bond-sites 222. For example, a support layer 230 composed of a photoimageable polymer can be patterned to expose the bond-sites 222. In embodiments where conductive members 228 project from the die 220 and are exposed by the material removal processes, the first redistribution structure 260 electrically connects the conductive members 228 to one or more of the interconnects 240.

Several embodiments of the assemblies 210 with interconnects 240 can provide consistent electrical properties. For example, the preformed interconnects 240 can be formed off-line apart from the packaging process such that they are consistently solid and void-free. Additionally, molding over the pre-inserted interconnects 240 can be a fast and relatively cost effective method of forming the interconnects through the encapsulant 250 because the foregoing process eliminates the patterning, etching, plating and filling processing steps used in conventional processes for forming interconnects.

One skilled in the art will appreciate that individual dies 220 can have additional bond-sites or active surfaces proximate to the second surface 292 of the package 210. Accordingly, in certain embodiments, the second redistribution structure 270 can also electrically connect to the die 220 to the second surface 292 of the package 210. A plurality of conductive features, such as the solder balls illustrated in FIG. 2, may also be attached to and project from the first and second redistribution structures 260 and 270. After forming the redistribution structures 260 and 270, the sub-assemblies 210 can be singulated from the workpiece 213. In certain embodiments, for example, the sub-assemblies can be singulated with a wafer saw or other singulating devices that are known in the art.

Figure 9:
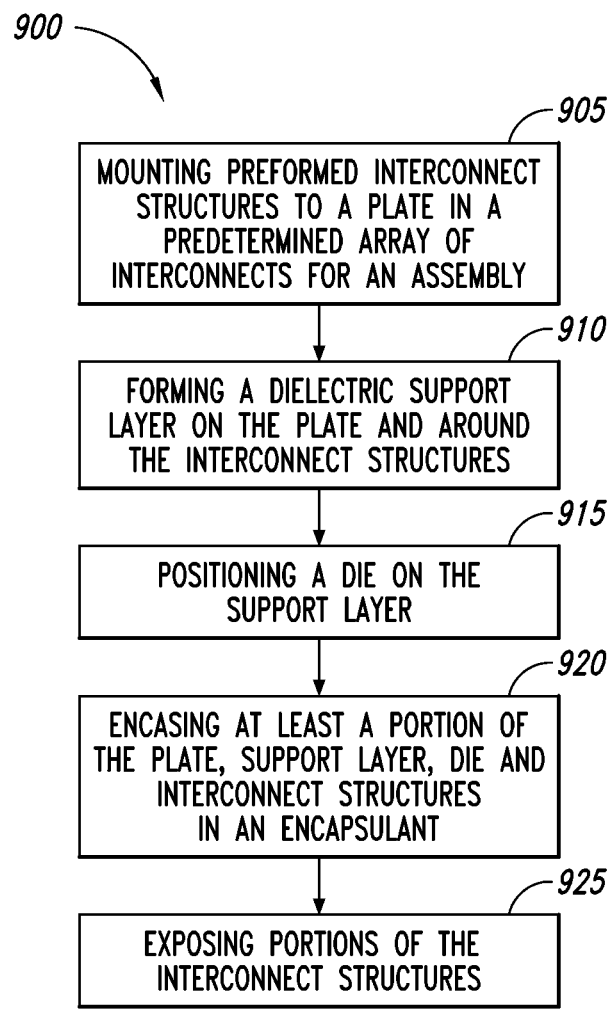
FIG. 9 is flow diagram of a process of forming a semiconductor assembly in accordance with still another embodiment of the invention.

FIG. 9 is a flow diagram of an embodiment of a method or process 900 for forming a semiconductor assembly. In this embodiment, the process 900 includes mounting preformed interconnect structures to a plate in a predetermined array of interconnects for the assembly (block 905). In one embodiment, a socket holding a plurality of the interconnect structures can simultaneously mount or insert the interconnect structures in apertures or recesses in the plate. Once the interconnect structures have been mounted, the socket can release the interconnect structures and move away from the plate. The plate can be made of a metallic or synthetic material, and the apertures or recesses can extend through the plate or to a predetermined depth of the plate. The process also includes forming a dielectric support layer on the plate and around the interconnect structures (block 910) and positioning a die on the support layer (920).

The process further includes encasing at least a portion of the plate, support layer, die and interconnect structures in an encapsulant (block 920). In certain embodiments encasing the components of the assembly can include forming a generally coplanar exterior surface of the encapsulant with second portions of the interconnect structures spaced apart from the support layer. In other embodiments, the second portions can be completely over-molded. The process also includes exposing portions of the interconnect structures (block 925). In certain embodiments, exposing these portions can include planarizing first and second sides of the assembly to expose the interconnect structures. As such, the plate can be a sacrificial layer and at least partially removed during the planarization. Exposing these portions in other embodiments can also include forming a generally coplanar first and second surfaces of the assembly with first and second portions of the interconnect structures.

The process illustrated in FIG. 9 can be accomplished in a short period of time because individual vias do not have to be formed, plated and filled to create the interconnect structures. Rather, the encapsulant encases the interconnects or pins after the pins have been retained in the predetermined array.

Figure 10A:
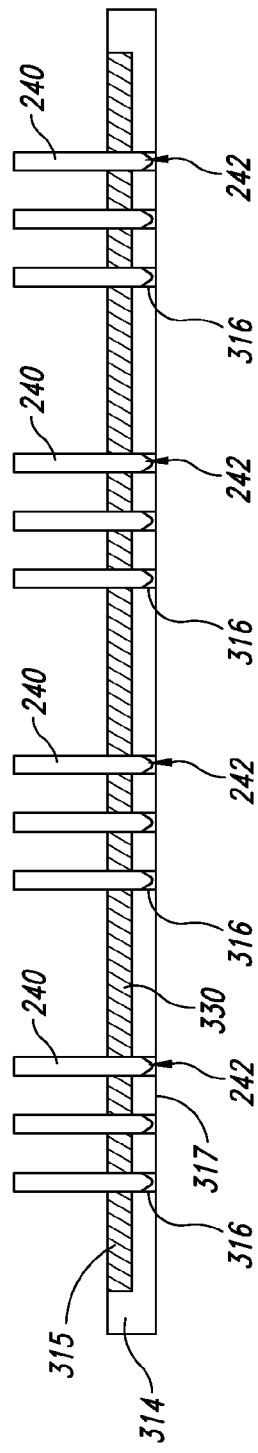
FIGS. 10A and 10B are side cross-sectional views illustrating various stages in a method of forming interconnects in a packaged semiconductor assembly in accordance with still another embodiment of the invention.
Figure 10B:
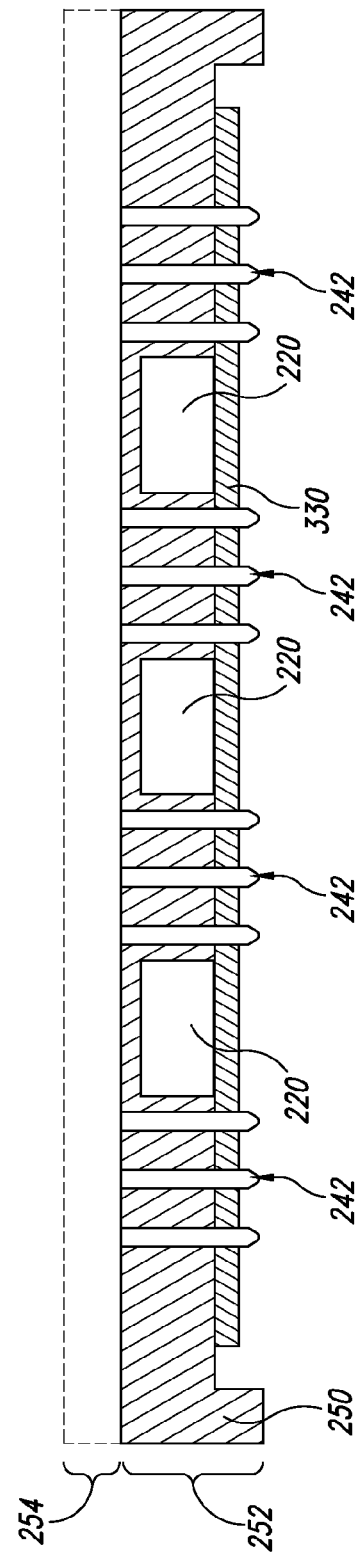

FIGS. 10A and 10B illustrate various stages in a method for forming interconnects in a semiconductor assembly in accordance with another embodiment of the invention. FIG. 10A, more specifically, is a side cross-sectional view of an embodiment of the invention having a plate 314 similar to the plate described above, except that the plate 314 can be removed from the sub-assembly or workpiece. The plate 314 releasably receives the plurality of the interconnects 240 in a plurality of recesses 316 arranged in a predetermined interconnect array. Individual recesses 316, however, do not extend all the way through the plate 314. Accordingly, when the first portion 242 of a pin 240 is inserted in the recess 316, the pin 240 does not extend to a lower surface 317 of the plate 314. In certain embodiments, the first portions 242 of the pins 240 can be configured to have a semi-blunt end portion, such as a dowel-like first portion 242 illustrated in FIGS. 10A and 10B. The plate 314 also includes a cavity 315 for receiving the support layer 230. After forming the support layer 330 in the cavity 315, processing can continue as described above with respect to FIGS. 5 and 6, including attaching a plurality of dies 220 to the support layer 330 and disposing the encapsulant 250 around the interconnects 240 and dies 220.

FIG. 10B illustrates a stage in which an encapsulant 250 has been disposed around the interconnects 240 and dies 220, and the plate 314 has been removed from the support layer 330 and interconnects 240. After the plate 314 is removed, processing can continue as described above with respect to FIGS. 7-8, including removing material and forming redistribution structures. The removable plate 314 illustrated in FIGS. 10A and 10B can save material cost and processing time because the material removal steps (e.g., planarizing) will not have to remove the plate 314 with the other package materials. The removable plate 314 can also be reused for other semiconductor assemblies having the same interconnect configuration.

FIGS. 11A-11C illustrate various stages in a method for forming interconnects in a semiconductor assembly according to still another embodiment of the invention. The manufacturing process and interconnects illustrated in FIGS. 11A-11C have similar features to the embodiments described above, however the first portions 242 of the interconnects 240 are retained solely by a support layer 430 and not inserted into a separate support plate. FIGS. 11A and 11B, for example, illustrate a stage in which the interconnects 240 are temporarily retained by a socket 402 and inserted into the support layer 430. The support layer 430 can be a polymer, and at the stage shown in FIGS. 11A and 11B the support layer is in a state in which the interconnects can penetrate the support layer 430. In certain embodiments, the first portions 242 of the interconnects 240 can have different configurations, such as the beveled or pointed first portions 243, flat portions 245 (shown at the right of FIG. 11A), or other configurations suitable for embedding and retaining the interconnects 240 in a stable manner. While the socket 402 holds the interconnects 240 in a desired configuration, the support layer 430 can be at least partially cured or otherwise processed to retain the interconnects 240 in the desired configuration. The socket 402 subsequently releases the second portions 244 of the interconnects (FIG. 11C) and the support layer 430 holds the interconnects 240 in place. At this stage, the second portions 244 of the interconnects 240 (e.g., pins) are free-standing without a solid material between the second portions 244. The support layer 430 can also provide an adhesive surface 434 to which a die (not shown) can be attached as described above.

The embodiment illustrated in FIGS. 11A-11C retains the interconnects 240 in a desired configuration in the support layer 430 without inserting the first portions 242 of the interconnects 240 into holes in a separate plate. Accordingly, this embodiment may mitigate the need to align the interconnects 240 with holes or recesses in a separate support plate.

Figure 12:
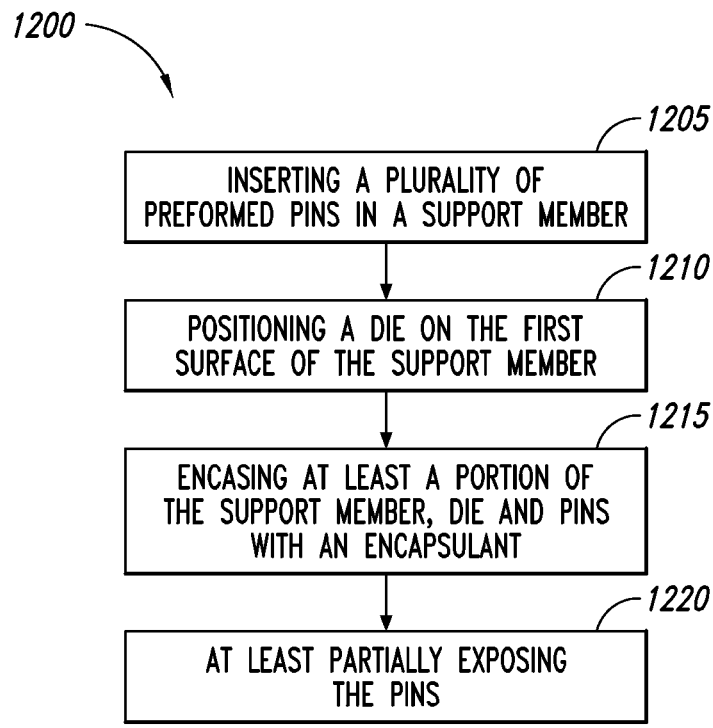
FIG. 12 is a flow diagram of a process of forming an interconnect in a packaged assembly in accordance with still another embodiment of the invention.

FIG. 12 is a flow diagram of an embodiment of a method or process 1200 for forming an interconnect. The process 1200 includes inserting a plurality of preformed pins in a support member (block 1205). The support member can at least partially retain the pins in a predetermined array. The pins can include a first portion in the support member and a second portion opposite the first portion. Moreover, the plurality of pins can be simultaneously inserted in the support member. In one example, a socket holds the second portions of the pins, inserts the first portions of the pins in the support member in the predetermined array, and releases the second portions after the first portions are inserted and retained in the support member. The process also includes positioning a die on a first surface of the support member (block 1210). In certain embodiments, the process can include at least partially curing the support member prior to positioning the die on the support layer. The process further includes encasing at least a portion of the die and pins with an encapsulant (block 1215) and at least partially exposing the pins (block 1220).

Figure 13:
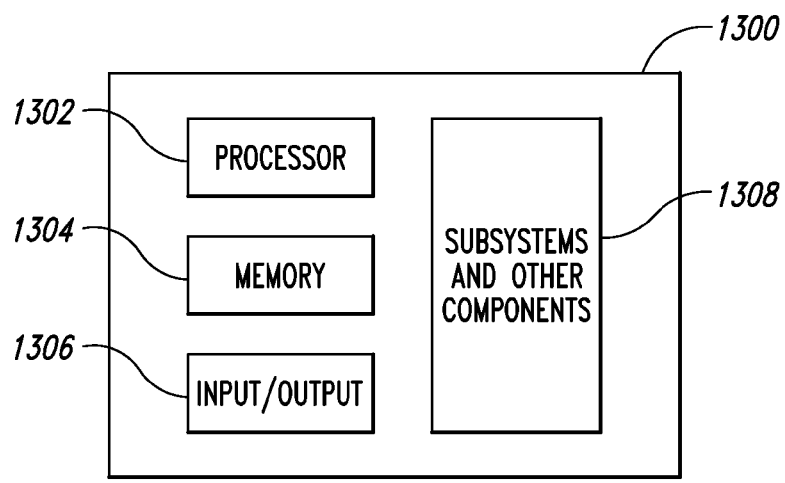
FIG. 13 is a schematic view of a system that incorporates packaged assemblies with interconnects in accordance with embodiments of the invention.

Any one of the semiconductor assemblies having the interconnects described above with reference to FIGS. 1-12 can be incorporated into any of a myriad of larger and/or more complex systems, a representative example of which is system 1300 shown schematically in FIG. 13. The system 1300 can include a processor 1302, a memory 1304 (e.g., SRAM, DRAM, flash and/or other memory devices), input/output devices 1306 and/or other subsystems or components 1308. The semiconductor assemblies having interconnects described above with reference to FIGS. 1-12 may be included in any of the components shown in FIG. 13. The resulting system 1300 can perform any of a wide variety of computing, processing, storage, sensing, imaging and/or other functions. Accordingly, the representative systems 1300 include, without limitation, computers and/or other data processors, for example, desktop computers, laptop computers, Internet appliances, hand-held devices (e.g., palm-top computers, wearable computers, cellular or mobile phones, personal digital assistants, music players, etc.), multi-processor systems, processor-based or programmable consumer electronics, network computers and minicomputers. Other representative systems 1300 may be housed in a single unit or distributed over multiple interconnected units (e.g., through a communication network). The components of the system 1300 can accordingly include local and/or remote memory storage devices, and any of a wide variety of computer readable media.

From the foregoing, it will be appreciated that specific embodiments of the invention have been described herein for purposes of illustration, but well-known structures and functions have not been shown or described in detail to avoid unnecessarily obscuring the description of the embodiments of the invention. For example, the backside of the dies 220 can be mounted to the support layer 230 such that the bond-sites 222 face away from the support layer 220. The bond-sites 222 can be protected during the molding procedure such that they are not covered by the encapsulant 250, and then the bond-sites 222 can be electrically connected to corresponding interconnects (e.g., via wire bonding or redistribution structure). Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

Various modifications may be made without deviating from the embodiments of the invention. For example, features described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. For example, the interconnect structures (e.g., pins) can be retained by another type of support member before molding the encapsulant around the die and interconnects. Accordingly, the invention is not limited except as by the appended claims.

We claim:

1. A method for packaging a microelectronic die, comprising:
    positioning a microelectronic die at a predetermined position on a dielectric support layer such that a plurality of preformed interconnects projecting from the dielectric support layer are spaced laterally apart from the microelectronic die;
    disposing a dielectric encapsulant between the preformed conductive interconnects and over at least a portion of the microelectronic die; and
    electrically coupling the microelectronic die to at least one of the conductive interconnects via at least one conductive member positioned in the dielectric support layer.

2. The method of claim 1, further comprising mounting the conductive interconnects to a plate before positioning the microelectronic die at the predetermined location on the dielectric support layer, and wherein the plate at least partially surrounds the dielectric support layer.

3. The method of claim 2, wherein the conductive interconnects are preformed pins and the method further comprises inserting the preformed pins into corresponding recesses in the plate.

4. The method of claim 3, wherein the conductive interconnects are preformed pins and the method further comprises inserting beveled portions of the preformed pins into the plate.

5. The method of claim 3, wherein the conductive interconnects are preformed pins and the method further comprises inserting pointed portions of the preformed pins into the plate.

6. The method of claim 2, wherein the conductive interconnects are preformed pins and the method further comprises inserting the preformed pins into the plate simultaneously.

7. The method of claim 2, further comprising:
    retaining the conductive interconnects in a socket;
    moving the socket toward the plate thereby inserting the conductive interconnects into the plate; and
    releasing the conductive interconnects from the socket after the conductive interconnects have been inserted into the plate.

8. The method of claim 2, further comprising at least partially removing the plate after disposing the dielectric encapsulant between the conductive interconnects.

9. The method of claim 1 wherein forming the plurality of conductive interconnects comprises inserting the conductive interconnects into the dielectric support layer and subsequently hardening the dielectric support layer.

10. The method of claim 1 wherein the conductive interconnectors include preformed pins.

11. A method for forming a semiconductor assembly, comprising:
    retaining an array of conductive interconnects in a support member;
    positioning a die relative to the array of conductive interconnects;
    positioning a conductive member corresponding to the die in the support member;
    disposing an encapsulant between the conductive interconnects such that the encapsulant contacts the conductive interconnects; and
    electrically coupling the die to at least one of the conductive interconnects via the conductive member positioned in the support member.

12. The method of claim 11 wherein the support member includes a plate and a dielectric support layer.

13. The method of claim 12, further comprising inserting beveled portions of the conductive interconnects into the plate.

14. The method of claim 12, further comprising inserting pointed portions of the conductive interconnects into the plate.

15. An assembly for packaging dies, comprising:
    a support plate having a plurality of die areas, wherein individual die areas are for packaging the dies;
    a dielectric support layer disposed on the support plate; and
    a plurality of preformed conductive interconnects, wherein individual interconnects have a first portion attached to the support plate and a second portion projecting from the dielectric support layer, wherein the conductive interconnects are arranged in discrete arrays at corresponding die areas.

16. The assembly of claim 15 wherein the dielectric support layer is a photoimageable polymer that adheres to the dies.

17. The assembly of claim 15 wherein the conductive interconnects in at least one of the discrete arrays are arranged in a predetermined pattern in at least one of the die areas outside of a footprint of a die, and a dielectric encapsulant is disposed between the conductive interconnects.

18. The assembly of claim 15 wherein the conductive interconnects comprises preformed pins having beveled tips for insertion into the support plate.

19. The assembly of claim 18, wherein the support plate comprises a hardened material having a plurality of preformed holes arranged in a pattern to receive the beveled tips of the preformed pins.

20. The assembly of claim 15 wherein the support plate comprises a partially cured epoxy without preformed holes and the conductive interconnects comprise preformed pins inserted into the partially cured epoxy.

* * * * *